Figure 1:
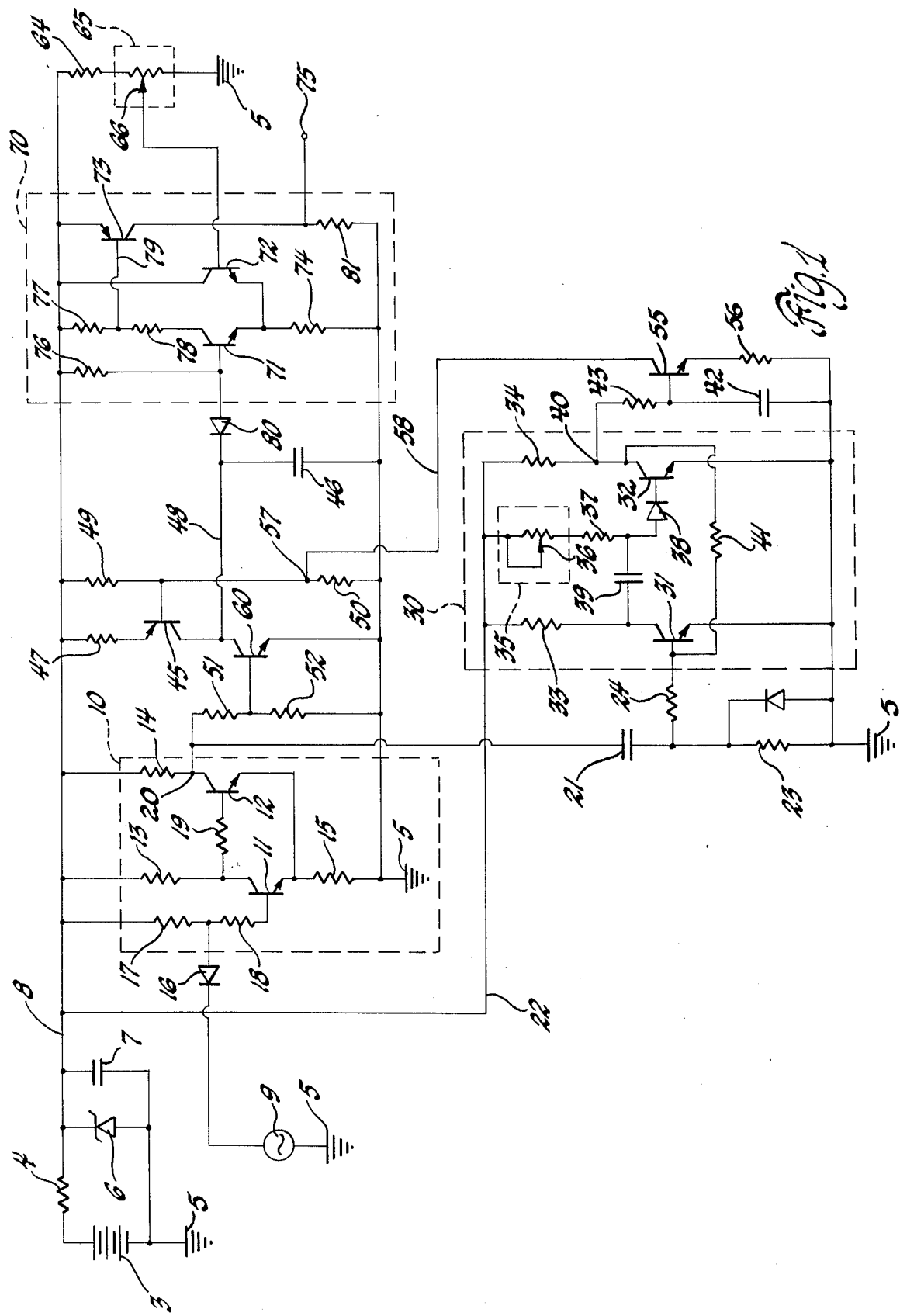

United States Patent [19]
Munden et al.

[11] B 3,988,618
[45] Oct. 26, 1976

[54] ELECTRICAL ANGLE DELAY CIRCUIT

[75] Inventors: Curtis D. Munden; Robert E. Campbell, both of Anderson, Ind.

[73] Assignee: General Motors Corporation, Detroit, Mich.

[22] Filed: Nov. 1, 1974

[21] Appl. No.: 519,932

[44] Published under the second Trial Voluntary Protest Program on February 3, 1976 as document No. B 519,932.

[52] U.S. Cl. ............................. 307/293; 307/265; 307/294; 328/129; 307/268
[51] Int. Cl.² ................... H03K 5/13; H03K 5/159
[58] Field of Search ........... 307/293, 265, 230, 228, 307/235, 268, 294; 328/129

[56] References Cited
UNITED STATES PATENTS

| | | | |
|---|---|---|---|
| 3,333,110 | 7/1967 | Schanne | 307/230 X |
| 3,403,268 | 9/1968 | Beckner et al. | 307/293 |
| 3,486,043 | 12/1969 | Johannessen | 307/265 |
| 3,486,067 | 12/1969 | Griffith et al. | 307/265 X |
| 3,571,626 | 3/1971 | Reif | 307/265 |
| 3,581,214 | 5/1971 | Seegmiller | 307/293 |
| 3,753,012 | 8/1973 | Frederiksen et al. | 307/293 |

*Primary Examiner*—Saxfield Chatmon, Jr.
*Attorney, Agent, or Firm*—Richard G. Stahr

[57] ABSTRACT

A Schmitt trigger circuit produces synchronizing signals during and of a pulse width equal to the positive half cycles of an alternating current input signal. A monostable multivibrator circuit is triggered to the alternate state by the leading edge of each synchronizing signal and the resulting series of alternate state output signals charges a capacitor to a direct current potential level range signal directly proportional to the frequency of the input signal. A direct current potential ramp timing signal generating circuit, which is reset and disenabled by the leading edge and enabled by the trailing edge of the synchronizing signals, generates a timing signal which increases linearly in potential level at a rate determined by the range signal. A potential level detector circuit responsive to the timing signal and a delay signal of a selectable direct current potential level produces an output signal when the potential level of the timing signal increases to that of the delay signal.

5 Claims, 2 Drawing Figures

3,988,618

1

ELECTRICAL ANGLE DELAY CIRCUIT

This invention is directed to an electrical delay circuit and, more specifically, to a circuit which provides a delay with respect to the electrical angle of an alternating current input signal.

Prior art electrical delay circuits provide for the delay of an electrical signal with respect to time. Because the prior art circuits are sensitive only to time, these circuits are not suitable for use with applications which require a constant delay with respect to an electrical angle of variable frequency alternating current input signals. Therefore, an electrical circuit which provides a selectable constant electrical angle delay, is desirable.

It is, therefore, an object of this invention to provide an improved electrical delay circuit.

It is another object of this invention to provide an improved electrical delay circuit which provides a delay with respect to electrical angle.

It is a further object of this invention to provide an improved electrical delay circuit which provides a selectable delay with respect to electrical angle at all frequencies of an alternating current input signal.

In accordance with this invention, an electrical angle delay circuit is provided wherein a direct current potential ramp timing signal, which is initiated at the positive to negative polarity zero crossover point of each cycle of a variable frequency alternating current input signal and increases linearly in potential level at a rate determined by the potential level of a range signal having a direct current potential level proportional to the frequency of the input signal, is compared with a delay signal of a selectable direct current potential level by a potential level comparator circuit which produces an output signal when the potential level of the timing signal increases to that of the delay signal.

Figure 2:
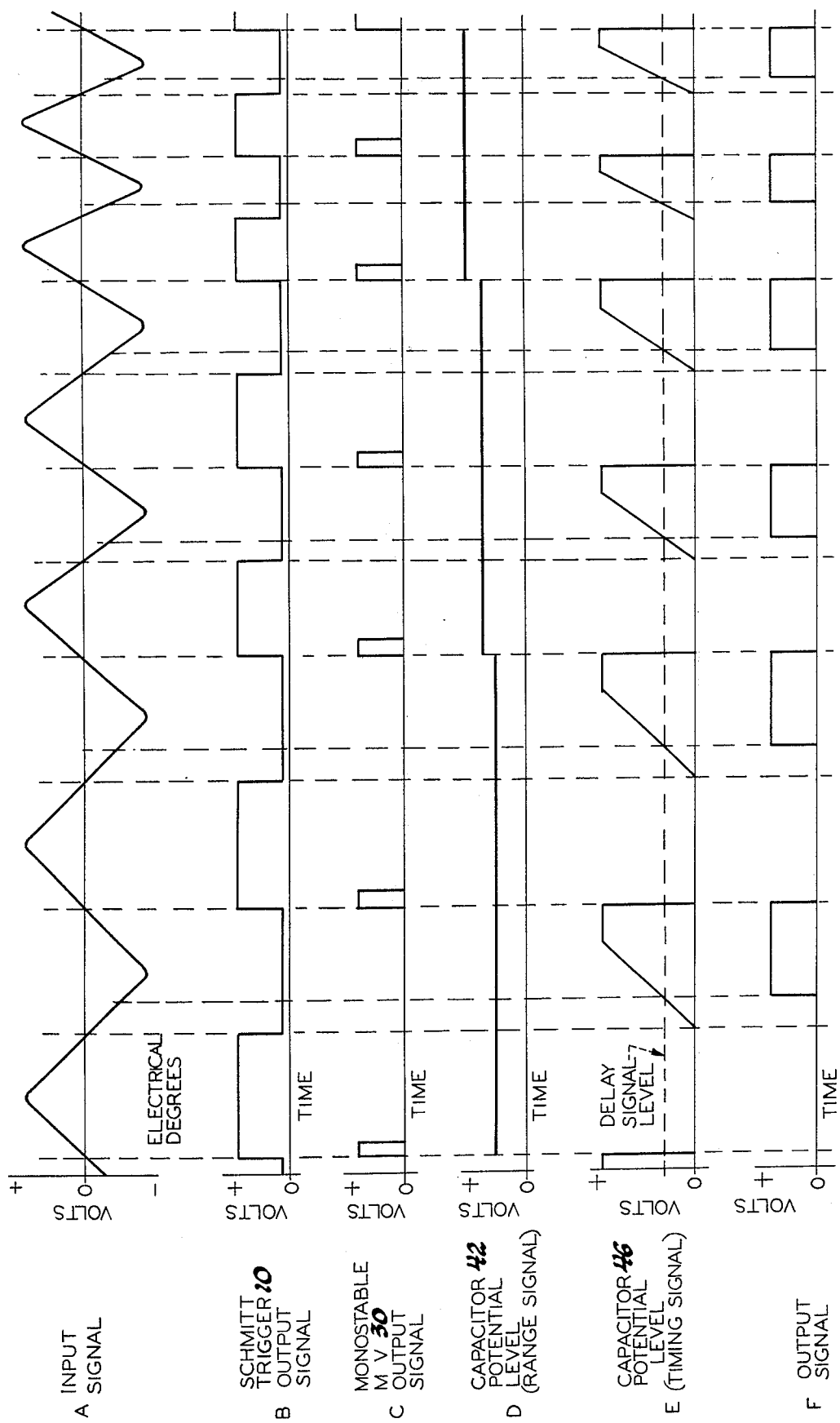

For a better understanding of the present invention, together with additional objects, advantages and features thereof, reference is made to the following description and accompanying drawing in which:

FIG. 1 sets forth the electrical angle delay circuit of this invention in schematic form; and FIG. 2 is a set of curves useful in understanding the operation of the circuit of FIG. 1.

As the point of reference or ground potential is the same point electrically throughout the system, it has been represented in FIG. 1 by the accepted schematic symbol and referenced by the numeral 5.

A direct current potential supply circuit is provided and includes a source of direct current potential, which may be a conventional storage battery 3, series resistor 4, Zener diode 6, filter capacitor 7, positive polarity potential bus 8 and point of reference or ground potential 5. It is to be specifically understood that any conventional source of direct current potential may be substituted by battery 3 without departing from the spirit of the invention. Series resistor 4 and Zener diode 6 serve to "clip" high positive polarity potential transients which may appear upon the supply line to prevent destruction of the electronic circuitry, they prevent negative polarity potential transients from damaging the electronic circuitry, they protect the electronic circuitry from accidental power supply reverse polarity and provide a substantially constant direct current supply or operating potential across positive polarity potential bus 8 and point of reference or ground potential 5.

2

FIG. 1 sets forth in schematic form the electrical delay circuit of this invention for producing an output signal which is delayed the same selectable number of electrical degrees from the positive to negative polarity zero crossover point of each cycle of all frequencies of a variable frequency alternating current input signal.

Curve A of FIG. 2 illustrates a variable frequency alternating current input signal which increases in frequency from left to right, as viewing FIG. 2, the frequency of the last two complete cycles being twice the frequency of the first two complete cycles. The source of the alternating current input signals may be any alternating current source and is schematically represented in FIG. 1 and referenced by the numeral 9.

Referring to FIG. 1, a conventional Schmitt trigger circuit 10 including two NPN transistors 11 and 12 having the collector-emitter electrodes thereof connected across positive polarity potential bus 8 and point of reference or ground potential 5 through respective collector resistors 13 and 14 and common emitter resistor 15 is responsive to the alternating current input signal for producing a direct current potential synchronizing signal, curve B of FIG. 2, having leading and trailing edges corresponding to the negative to positive polarity zero crossover point and to the positive to negative polarity zero crossover point, respectively, of each cycle of the alternating current input signal. The alternating current input signal is applied through diode 16 to the junction between series base bias resistors 17 and 18 of Schmitt trigger circuit 10. During the negative polarity half cycles of the alternating current input signal, diode 16 is forward poled. While diode 16 is forward poled, base-emitter drive current is diverted therethrough from transistor 11, consequently, transistor 11 is not conductive. While transistor 11 is not conductive, base-emitter drive current is supplied to transistor 12 through resistors 13 and 19, consequently, transistor 12 is conducting through the collector-emitter electrodes and the output signal thereof, which appears across junction 20 and point of reference or ground potential 5, is "low" or above ground potential by a level equal to the collector-emitter drop of transistor 12 and the drop across common emitter resistor 15. During the positive polarity half cycles of the alternating current input signal, diode 16 is reverse biased. With diode 16 reverse biased, collector-emitter drive current is supplied through resistors 17 and 18 to transistor 11, consequently, transistor 11 conducts through the collector-emitter electrodes. With transistor 11 conducting through the collector-emitter electrodes, base drive current is diverted therethrough from transistor 12, consequently, transistor 12 extinguishes. When transistor 12 extinguishes, the output signal of Schmitt trigger circuit 10 is "high" or of a positive polarity upon junction 20 with respect to point of reference or ground potential 5 and of a magnitude equal to the supply potential of battery 3 minus the drop across resistor 14. This rise of the output signal of Schmitt trigger circuit 10 is the leading edge of the synchronizing signal.

The synchronizing signals are applied through coupling capacitor 21 to the input circuitry of a conventional monostable multivibrator circuit 30. Monostable multivibrator circuit 30 includes two NPN transistors 31 and 32 having the collector-emitter electrodes thereof connected across positive polarity potential bus 8 through lead 22 and respective collector resistors 33 and 34 and point of reference or ground potential 5. As is well known in the electronics art, the monostable multivibrator circuit normally operates in a stable state and may be switched to an alternate state by an electrical signal, in which it remains for a period of time as determined by an interior R-C timing network. After "timing out", the device spontaneously returns to the stable state. In the stable state, base-emitter drive current is supplied to NPN transistor 32 through potentiometer 35, series resistor 37 and diode 38, consequently, transistor 32 is conductive through the collector-emitter electrodes. When the synchronizing signals go high, coupling capacitor 21 begins to charge and the charging current produces a potential drop across series resistor 23 which is of a sufficient magnitude to break down the emitter-base junction of transistor 31. When this junction breaks down, base-emitter drive current is supplied to NPN transistor 31 through base resistor 24, consequently, transistor 31 is triggered conductive by the leading edge of the synchronizing signals. When transistor 31 begins to conduct, base drive current is diverted therethrough from transistor 32, consequently, transistor 32 extinguishes, timing capacitor 39 charges through potentiometer 35, resistor 37, and the collector-emitter electrodes of transistor 31 and point of reference or ground potential 5 and monostable multivibrator circuit 30 is in the alternate state to which it is triggered by the leading edge of the synchronizing signals. When in the alternate state, the output signal of monostable multivibrator circuit 30 is high and is of a positive polarity upon junction 40 with respect to point of reference or ground potential 5, curve C of FIG. 2. When timing capacitor 39 has become charged, base-emitter drive current is again supplied to transistor 32 to trigger this device conductive through the collector-emitter electrodes. When transistor 32 conducts through the collector-emitter electrodes, the output of monostable multivibrator circuit 30 goes low, with the potential upon junction 40 being above ground potential by an amount equal to the collector-emitter drop of transistor 32. This substantially ground potential is fed back through feedback resistor 41 to the base electrode of transistor 31 to help trigger this device not conductive, thus enhancing the switching action of monostable multivibrator 30 from the alternate to the stable state. The pulse width of each of the output signals of monostable multivibrator circuit 30 is determined by the R-C time constant of the charging circuit for timing capacitor 39, as is well known in the electronics art. Therefore, monostable multivibrator circuit 30 produces a series of output signal pulses, curve C of FIG. 2, in response to the leading edges of the synchronizing signals and of a width determined by the R-C time constant of the charging circuit for timing capacitor 39. While the output signal of monostable multivibrator circuit 30 is high, capacitor 42 charges through resistor 43. As capacitor 42 is charged by the high output signal of monostable multivibrator circuit 30 while this device is in the alternate state and since monostable multivibrator circuit 30 is triggered to the alternate state at the frequency of the alternating current input signal, capacitor 42 becomes charged to a direct current potential level directly proportional to the frequency of the alternating current input signal, curve D of FIG. 2. For reasons to be hereinafter explained, this signal will be termed the range signal. From this description, it is apparent that monostable multivibrator circuit 30 and capacitor 42 comprise circuitry responsive to each leading edge of the synchronizing signals for producing a range signal, curve D of FIG. 2, of a direct current potential level directly proportional to the frequency of the alternating current input signal.

To produce a direct current potential ramp timing signal, the emitter-collector electrodes of a PNP transistor 45 and a timing circuit capacitor 46 are connected in series across battery 3 through a circuit which may be traced from the positive polarity terminal of battery 3, through resistor 4, positive polarity potential bus 8, emitter resistor 47, the emitter-collector electrodes of transistor 45, lead 48, timing circuit capacitor 46 and point of reference or ground potential 5 to negative polarity terminal of battery 3. While transistor 45 is conductive through the emitter-collector electrodes, therefore, timing circuit capacitor 46 receives a direct current potential charge which increases linearly in potential level at a rate determined by the degree of conduction through transistor 45. The base electrode of transistor 45 is connected to the junction between resistors 49 and 50 connected in series across positive polarity potential bus 8 and point of reference or ground potential 5. The ohmic value of resistor 50, therefore, establishes the minimum amount of emitter-base drive current supplied transistor 45, and, hence, the minimum degree of conduction through the emitter-collector electrodes thereof and the minimum rate at which the direct current potential charge upon timing circuit capacitor 46 increases linearly in potential level. The timing circuit just described, however, is electrically arranged to be influenced by the range signal produced by monostable multivibrator circuit 30 and capacitor 42. The base electrode of NPN transistor 55 is connected to the junction between resistor 43 and capacitor 42, consequently, the charge upon capacitor 42, the range signal, supplies base-emitter drive current to transistor 55 to render transistor 55 conductive through the collector-emitter electrodes, the degree of conduction being proportional to the magnitude of the range signal, the charge upon capacitor 42. Conducting transistor 55 establishes an electrical circuit in parallel with resistor 50 to point of reference or ground potential 5 which may be traced from junction 57, through lead 58, the collector-emitter electrodes of transistor 55 and emitter resistor 56 to point of reference or ground potential 5. While transistor 55 is conducting, therefore, the emitter-base drive current supplied to transistor 45 is greater than the minimum as determined by resistor 50 by an amount proportional to the degree of conduction through transistor 55 which results in a greater emitter-collector current flow through transistor 45 by an amount proportional to the greater emitter-base drive current supplied thereto. Therefore, the greater the degree of conduction through transistor 55, the greater is the rate at which the direct current potential charge upon timing capacitor 46 increases linearly in potential level. As the range signal potential level magnitude determines the degree of conduction through transistor 55 and is of a direct current potential level directly proportional to the frequency of the alternating current input signal and since the degree of emitter-collector conduction through transistor 45 increases under the influence of an increasing range signal to more rapidly charge capacitor 45, the net result is a direct current potential ramp timing signal generator circuit, which is synchronized with the input signal cycles and produces a direct current potential ramp timing signal which increases linearly in potential magnitude at a rate or slope which is a function of input signal frequency, curve E of FIG. 2.

The synchronizing signals produced by Schmitt trigger circuit 10 are also applied across resistors 51 and 52 connected in series across junction 20 and point of reference or ground potential 5. The base electrode of NPN transistor 60 is connected to the junction between series resistors 51 and 52, the emitter electrode thereof is connected to point of reference or ground potential 5 and the collector electrode is connected to the junction between the collector electrode of transistor 45 and timing circuit capacitor 46. During the presence of each of the synchronizing signals, base-emitter drive current is supplied to transistor 60 through positive polarity potential bus 8, and resistors 14 and 51 to maintain transistor 60 conductive through the collector-emitter electrodes. While transistor 60 is conductive, any charge upon timing circuit capacitor 46 is discharged therethrough and the timing circuit is disenabled as the collector-emitter electrodes of conducting transistor 60 establish a substantially short circuit across timing circuit capacitor 46, thus preventing capacitor 46 from receiving a charge. In the absence of the synchronizing signals, transistor 60 is not conductive through the collector-emitter electrodes, consequently, timing circuit capacitor 46 receives a charge through the circuit previously described. Transistor 60 and the associated series resistors 51 and 52, therefore, comprise circuit means responsive to the presence of each of the synchronizing signals for resetting and disenabling the timing circuit and to the absence of the synchronizing signals for enabling the timing circuit. Timing circuit capacitor 46 may not become fully charged during the time the timing circuit is enabled. Without intention or inference of a limitation, curve E of FIG. 3 illustrates that timing capacitor 46 does become fully charged during this period.

As the timing circuit is enabled during the absence of synchronizing signals and since the synchronizing signals are absent during the negative polarity half cycles of the alternating current input signal, the timing circuit comprising transistor 45, resistors 47, 49 and 50 and timing circuit capacitor 46 produces a direct current potential ramp timing signal, curve E of FIG. 2, which is initiated at the positive to negative polarity zero crossover point of each cycle of the alternating current input signal and increases linearly in potential level at a rate determined by the potential level of the range signal.

To select the number of electrical degrees from the positive to negative polarity zero crossover point of each cycle of all frequencies of a variable frequency alternating current input signal at which an output signal is to be produced, the required electrical angle delay, circuitry is provided for producing a delay signal of a selectable direct current potential level. This circuit includes resistor 64 and potentiometer 65 connected in series across positive polarity potential bus 8 and point of reference or ground potential 5. The direct current potential level of the delay signal is equal to the potential across movable contact 66 of potentiometer 65 and point of reference or ground potential 5 and is, therefore, selectable by adjusting movable contact 66.

A potential level detector circuit 70 senses the direct current potential ramp timing signal and the direct current delay signal and produces an output signal, curve F of FIG. 2, when the potential level of the timing signal increases to a direct current potential level approximately 0.7 volt, the drop across diode 80, less than that of the delay signal. Potential level detector circuit 70 includes NPN transistors 71, 72 and PNP transistor 73. While the delay signal is of a potential magnitude greater than the timing signal, base-emitter drive current is supplied to transistor 72 from positive polarity potential bus 8, through resistor 64, through that portion of potentiometer 65 between the end thereof connected to resistor 64 and movable contact 66, the base-emitter electrodes of transistor 72, emitter resistor 74 and point of reference or ground potential 5 to the negative polarity terminal of battery 3, consequently, transistor 72 is conductive through the collector-emitter electrodes. With transistor 72 conductive through the collector-emitter electrodes, the potential drop across emitter resistor 74 is of a magnitude which places the emitter electrode of transistor 71 at substantially the same potential as the base electrode thereof, consequently, transistor 71 is not conductive. While transistor 71 is not conductive, there is no circuit through which emitter-base drive current is applied to PNP transistor 73, hence, the output signal across output circuit terminal 75 and point of reference or ground potential 5 is substantially ground potential. When the timing signal has increased to a magnitude approximately 0.7 volt, the drop across diode 80, less than the delay signal, diode 80 is reverse biased, consequently, base-emitter drive current is supplied to transistor 71 from positive polarity potential bus 8, through resistor 76, the base-emitter electrodes of transistor 71, emitter resistor 74 and point of reference or ground potential 5 to the negative polarity terminal of battery 3 to trigger transistor 71 conductive through the collector-emitter electrodes, a condition which extinguishes transistor 72. While transistor 71 is conductive through the collector-emitter electrodes, current flows through series resistors 77 and 78 and a circuit is completed through which emitter-base drive current is supplied to transistor 73 which may be traced from positive polarity potential bus 8, through the emitter-base electrodes of transistor 73, lead 79, resistor 78, the collector-emitter electrodes of transistor 71, emitter resistor 74 and point of reference or ground potential 5 to the negative polarity terminal of battery 3. While transistor 71 is conducting, therefore, transistor 73 conducts through the collector-emitter electrodes and an output signal appears across output circuit terminal 75 and point of reference or ground potential 5 of a positive polarity upon output terminal 75 with respect to point of reference or ground potential 5 and of a magnitude equal to the potential drop across collector resistor 81, curve F of FIG. 2.

Referring to FIG. 2, with a delay signal of a direct current potential level indicated by the horizontal dashed line of curve E, the output electrical signal is delayed the same number of electrical degrees, 45°, from the positive to negative polarity zero crossover point of each cycle of all frequencies of the variable frequency alternating current input signal.

For purposes of illustrating the operation of the electrical angle delay circuit of this invention, it will be assumed that a variable frequency alternating current input signal having a minimum frequency of 60 cycles per second is applied to the input circuit and that movable contact 36 of range adjustment potentiometer 35 is adjusted to the point at which timing capacitor 46 charges to 9 volts in 8 milliseconds which is at a rate of 1.125 volts per millisecond or 0.05 volt per electrical degree:

I. To obtain a delay period of 45 electrical degrees, movable contact 66 of potentiometer 65 is adjusted to the point at which a delay signal of a direct current potential level of 2.25 volts, the product of 45 electrical degrees multiplied by 0.05 volt per electrical degree, is present across movable contact 66 and point of reference or ground potential 5. At an input signal frequency of 60 cycles per second, the direct current potential ramp timing signal, the charge upon timing capacitor 46, rises to 2.25 volts in 2.0 milliseconds. At a 60 cycles per second frequency, 2.0 milliseconds of time is equivalent to 45 electrical degrees. At an input signal frequency of 80 cycles per second, monostable multivibrator circuit 30 is triggered to the alternating state at a frequency 1.33 times greater than at the 60 cycles per second input signal frequency. The range signal, therefore, is 1.33 times greater, curve D of FIG. 2, than at a 60 cycles per second input signal frequency. This greater direct current potential range signal produces a 1.33 times greater collector-emitter conduction through transistor 55, consequently, emitter-collector conduction through transistor 45 is 1.33 times greater to charge timing capacitor 46 at a rate 1.33 times faster. At an input signal frequency of 80 cycles per second, therefore, timing capacitor 46 charges to 9 volts in 6 milliseconds, which is at a rate of 1.5 volts per millisecond, to produce a direct current potential ramp timing signal which rises to 2.25 volts in 1.5 milliseconds. At an 80 cycles per second frequency, 1.5 milliseconds of time is equivalent to 45 electrical degrees. At an input signal frequency of 120 cycles per second, monostable multivibrator circuit 30 is triggered to the alternating state at a frequency 2.0 times greater than at the 60 cycles per second input signal frequency. The range signal, therefore, is 2.0 times greater, curve D of FIG. 2, than at a 60 cycles per second input signal frequency. This greater direct current potential range signal produces a 2.0 times greater collector-emitter conduction through transistor 55, consequently, emitter-collector conduction through transistor 45 is 2.0 times greater to charge timing capacitor 46 at a rate 2.0 times faster. At an input signal frequency of 120 cycles per second, therefore, timing capacitor 46 charges to 9 volts in 4 milliseconds, which is at a rate of 2.25 volts per millisecond, to produce a direct current potential ramp timing signal which rises to 2.25 volts in 1.0 millisecond. At a 120 cycles per second frequency, 1.0 millisecond of time is equivalent to 45 electrical degrees. Consequently, potential level detector circuit 70 produces an output signal 45 electrical degrees after each positive to negative polarity zero crossover point of the alternating current input signal at all input signal frequencies.

II. To obtain a delay period of 30 electrical degrees, movable contact 66 of potentiometer 65 is adjusted to the point at which a delay signal of a direct current potential level of 1.5 volts, the product of 30 electrical degrees multiplied by 0.05 volt per electrical degree, is present across movable contact 66 and point of reference or ground potential 5. At an input signal frequency of 60 cycles per second, the direct current potential ramp timing signal, the charge upon timing capacitor 46, rises to 1.5 volts in 1.3 milliseconds. At a 60 cycles per second frequency, 1.3 milliseconds of time is equivalent to 30 electrical degrees. At an input signal frequency of 80 cycles per second, monostable multivibrator circuit 30 is triggered to the alternating state at a frequency 1.33 times greater than at the 60 cycles per second input signal frequency. The range signal, therefore, is 1.33 times greater, curve D of FIG. 2, that at a 60 cycles per second input signal frequency. This greater direct current pootential range signal produces a 1.33 times greater collector-emitter conduction through transistor 55, consequently, emitter-collector conduction through transistor 45 is 1.33 times greater to charge timing capacitor 46 at a rate 1.33 times faster. At an input signal frequency of 80 cycles per second, therefore, timing capacitor 46 charges to 9 volts in 6 milliseconds, which is at a rate of 1.5 volts per millisecond, to produce a direct current potential ramp timing signal which rises to 1.5 volts in 1.0 millisecond. At an 80 cycles per second frequency, 1.0 millisecond of time is equivalent to 30 electrical degrees. At an input signal frequency of 120 cycles per second, monostable multivibrator circuit 30 is triggered to the alternating state at a frequency 2.0 times greater than at the 60 cycles per second input signal frequency. The range signal, therefore, is 2.0 times greater, curve D of FIG. 2, than at a 60 cycles per second input signal frequency. This greater direct current potential range signal produces a 2.0 times greater collector-emitter conduction through transistor 55, consequently, emitter-collector conduction through transistor 45 is 2.0 times greater to charge timing capacitor 46 at a rate 2.0 times faster. At an input signal frequency of 120 cycles per second, therefore, timing capacitor 46 charges to 9 volts per second, therefore, timing capacitor 46 charges to 9 volts in 4 milliseconds, which is at a rate of 2.25 volts per millisecond, to produce a direct current potential ramp timing signal which rises to 1.5 volts in 0.65 millisecond. At 120 cycles per second frequency, 0.65 millisecond of time is equivalent to 30 electrical degrees. Consequently, potential level detector circuit 70 produces an output signal 30 electrical degrees after each positive to negative polarity zero crossover point of the alternating current input signal at all input signal frequencies.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. An electrical angle delay circuit for producing an output signal which is delayed the same selectable number of electrical degrees from the positive to negative polarity zero crossover point of each cycle of all frequencies of a variable frequency alternating current input signal comprising: circuit means responsive to said alternating current input signal for producing a direct current potential synchronizing signal having leading and trailing edges corresponding to the negative to positive polarity zero crossover point and to the positive to negative polarity zero crossover point, respectively, of each cycle of said alternating current input signal; circuit means responsive to said leading edge of said synchronizing signals for producing a range signal of a direct potential level directly proportional to the frequency of said alternating current input signal; timing circuit means arranged to be electrically influenced by said range signal for producing a direct current potential ramp timing signal which is initiated at the positive to negative polarity zero crossover point of each cycle of said alternating current input signal and increases linearly in potential level at a rate determined by the potential level of said range signal; means for producing a delay signal of a selectable direct current potential level; and circuit means responsive to said timing signal and said delay signal for producing an output signal when the potential level of said timing signal increases to that of said delay signal.

2. An electrical angle delay circuit for producing an output signal which is delayed the same selectable number of electrical degrees from the positive to negative polarity zero crossover point of each cycle of all frequencies of a variable frequency alternating current input signal comprising: circuit means responsive to said alternating current input signal for producing a direct current potential synchronizing signal having leading and trailing edges corresponding to the negative to positive polarity zero crossover point and to the positive to negative polarity zero crossover point, respectively, of each cycle of said alternating current input signal; circuit means responsive to said leading edge of said synchronizing signals for producing a range signal of a direct current potential level directly proportional to the frequency of said alternating current input signal; timing circuit means arranged to be electrically influenced by said range signal for producing a direct current potential ramp timing signal which is initiated at the positive to negative polarity zero crossover point of each cycle of said alternating current input signal and increases linearly in potential level at a rate determined by the potential level of said range signal; means for producing a delay signal of a selectable direct current potential level; circuit means responsive to said timing signal and said delay signal for producing an output signal when the potential level of said timing signal increases to a direct current potential level equal to that of said delay signal; and means for selectively adjusting the rate at which said direct current potential ramp timing signal increases in potential level.

3. An electrical angle delay circuit for producing an output signal which is delayed the same selectable number of electrical degrees from the positive to negative polarity zero crossover point of each cycle of all frequencies of a variable frequency alternating current input signal comprising: circuit means responsive to said alternating current input signal for producing a direct current potential synchronizing signal having leading and trailing edges corresponding to the negative to positive polarity zero crossover point and to the positive to negative polarity zero crossover point, respectively, of each cycle of said alternating current input signal; circuit means responsive to said leading edge of said synchronizing signals for producing a range signal of a direct current potential level directly proportional to the frequency of said alternating current input signal; timing circuit means arranged to be electrically influenced by said range signal for producing a direct current potential ramp timing signal which is initiated at the positive to negative polarity zero crossover point of each cycle of said alternating current input signal and increases linearly in potential level at a rate determined by the potential level of said range signal; circuit means responsive to the presence of each of said synchronizing signals for resetting and disenabling said timing circuit means and to the absence of said synchronizing signals for enabling said timing circuit means; means for producing a delay signal of a selectable direct current potential level; circuit means responsive to said timing signal and said delay signal for producing an output signal when the potential level of said timing signal increases to a direct current potential level equal to that of said delay signal; means for selectively adjusting the rate at which said direct current potential ramp timing signal increases in potential level.

4. An electrical angle delay circuit for producing an output signal which is delayed the same selectable number of electrical degrees from the positive to negative polarity zero crossover point of each cycle of all frequencies of a variable frequency alternating current input signal comprising: trigger circuit means responsive to said alternating current input signal for producing a direct current potential synchronizing signal having leading and trailing edges corresponding to the negative to positive polarity zero crossover point and to the positive to negative polarity zero crossover point, respectively, of each cycle of said alternating current input signal; a resistor; a capacitor; circuit means including a monostable multivibrator circuit and said resistor and capacitor in series for producing a range signal of a direct current potential level directly proportional to the frequency of said alternating current input signal in response to said leading edge of said synchronizing signals; timing circuit means arranged to be electrically influenced by said range signal for producing a direct current potential ramp timing signal which is initiated at the positive to negative polarity zero crossover point of each cycle of said alternating current input signal and increases linearly in potential level at a rate determined by the potential level of said range signal; means for producing a delay signal of a selectable direct current potential level; circuit means responsive to said timing signal and said delay signal for producing an output signal when the potential level of said timing signal increases to a direct current potential level equal to that of said delay signal.

5. An electrical angle delay circuit for producing an output signal which is delayed the same selectable number of electrical degrees from the positive to negative polarity zero crossover point of each cycle of all frequencies of a variable frequency alternating current input signal comprising: trigger circuit means responsive to said alternating current input signal for producing a direct current potential synchronizing signal having leading and trailing edges corresponding to the negative to positive polarity zero crossover point and to the positive to negative polarity zero crossover point, respectively, of each cycle of said alternating current input signal; a resistor; a capacitor; circuit means including a monostable multivibrator circuit and said resistor and capacitor in series for producing a range signal of a direct current potential level directly proportional to the frequency of said alternating current input signal in response to said leading edge of said synchronizing signals; timing circuit means arranged to be electrically influenced by said range signal for producing a direct current potential ramp timing signal which is initiated at the positive to negative polarity zero crossover point of each cycle of said alternating current input signal and increases linearly in potential level at a rate determined by the potential level of said range signal; circuit means responsive to the presence of each of said synchronizing signals for resetting and disenabling said timing circuit means and to the absence of said synchronizing signals for enabling said timing circuit means; means for producing a delay signal of a selectable direct current potential level; circuit means responsive to said timing signal and said delay signal for producing an output signal when the potential level of said timing signal increases to a direct current potential level equal to that of said delay signal; and means for selectively adjusting the rate at which said direct current potential ramp timing signal increases in potential level.

* * * * *